US007137353B2

(12) United States Patent
Saigusa et al.

(10) Patent No.: US 7,137,353 B2
(45) Date of Patent: *Nov. 21, 2006

(54) METHOD AND APPARATUS FOR AN IMPROVED DEPOSITION SHIELD IN A PLASMA PROCESSING SYSTEM

(75) Inventors: Hidehito Saigusa, Nirasaki (JP); Taira Takase, Nirasaki (JP); Kouji Mitsuhashi, Nirasaki (JP); Hiroyuki Nakayama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 50 days.

This patent is subject to a terminal disclaimer.

(21) Appl. No.: 10/259,353

(22) Filed: Sep. 30, 2002

(65) Prior Publication Data

US 2004/0060657 A1    Apr. 1, 2004

(51) Int. Cl.
*C23C 16/00* (2006.01)
(52) U.S. Cl. .................... 118/723 R; 156/916
(58) Field of Classification Search ............ 118/723 R; 156/916
See application file for complete search history.

(56) References Cited

U.S. PATENT DOCUMENTS

| 4,310,390 A | 1/1982 | Bradley et al. |
| 4,357,387 A | 11/1982 | George et al. ............ 442/71 |
| 4,469,619 A | 9/1984 | Ohno et al. |
| 4,593,007 A | 6/1986 | Novinski |
| 4,612,077 A | 9/1986 | Tracy et al. |
| 4,842,683 A | 6/1989 | Cheng et al. |
| 4,877,757 A | 10/1989 | York et al. |
| 5,000,113 A | 3/1991 | Wang et al. |
| 5,074,456 A | 12/1991 | Degner et al. |
| 5,334,462 A | 8/1994 | Vine et al. |
| 5,362,335 A | 11/1994 | Rungta |
| 5,366,585 A * | 11/1994 | Robertson et al. ............ 216/67 |
| 5,423,936 A | 6/1995 | Tomita et al. |
| 5,426,310 A | 6/1995 | Tamada et al. |
| 5,484,752 A | 1/1996 | Waku et al. |
| 5,494,713 A | 2/1996 | Ootuki |
| 5,521,790 A | 5/1996 | Ruckel et al. ............ 361/234 |
| 5,551,190 A | 9/1996 | Yamagishi et al. |
| 5,556,501 A | 9/1996 | Collins et al. |
| 5,614,055 A | 3/1997 | Fairbairn et al. |
| 5,637,237 A | 6/1997 | Oehrlein et al. |
| 5,641,375 A * | 6/1997 | Nitescu et al. ............ 156/345.1 |
| 5,680,013 A | 10/1997 | Dornfest et al. |
| 5,725,960 A | 3/1998 | Konishi et al. |
| 5,759,360 A | 6/1998 | Ngan et al. |
| 5,798,016 A | 8/1998 | Oehrlein et al. |

(Continued)

FOREIGN PATENT DOCUMENTS

DE      94 21 671      7/1996

(Continued)

OTHER PUBLICATIONS

Production drawing for Deposition Shield, Upper believed to be sold in the U.S. on Apr. 12, 2000.

(Continued)

*Primary Examiner*—Parviz Hassanzadeh
*Assistant Examiner*—Michelle Crowell
(74) *Attorney, Agent, or Firm*—Oblon, Spivak, McClelland, Maier & Neustadt, P.C.

(57) ABSTRACT

The present invention presents an improved deposition shield for surrounding a process space in a plasma processing system, wherein the design and fabrication of the deposition shield advantageously provides for a clean processing plasma in the process space with substantially minimal erosion of the deposition shield.

49 Claims, 11 Drawing Sheets

U.S. PATENT DOCUMENTS

| | | | |
|---|---|---|---|
| 5,834,070 A | 11/1998 | Movchan et al. | |
| 5,851,343 A | 12/1998 | Hsu | |
| 5,868,848 A | 2/1999 | Tsukamoto | |
| 5,879,575 A | 3/1999 | Tepman et al. | |
| 5,885,356 A | 3/1999 | Zhao et al. | |
| 5,885,402 A | 3/1999 | Esquibel | 156/345.24 |
| 5,891,253 A | 4/1999 | Wong et al. | |
| 5,892,278 A | 4/1999 | Horita et al. | 257/706 |
| 5,894,887 A | 4/1999 | Kelsey et al. | |
| 5,895,586 A | 4/1999 | Kaji et al. | |
| 5,900,064 A | 5/1999 | Kholodenko | |
| 5,902,763 A | 5/1999 | Waku et al. | |
| 5,911,852 A | 6/1999 | Katayama et al. | |
| 5,919,332 A | 7/1999 | Koshiishi et al. | |
| 5,925,228 A | 7/1999 | Panitz et al. | 204/484 |
| 5,944,902 A | 8/1999 | Redeker et al. | |
| 5,952,054 A | 9/1999 | Sato et al. | |
| 5,952,060 A | 9/1999 | Ravi | |
| 5,955,182 A | 9/1999 | Yasuda et al. | |
| 5,968,377 A | 10/1999 | Yuasa et al. | |
| 5,985,102 A | 11/1999 | Leiphart | |
| 5,994,662 A | 11/1999 | Murugesh | |
| 6,068,729 A | 5/2000 | Shrotriya | 156/345.26 |
| 6,073,449 A | 6/2000 | Watanabe et al. | 62/3.2 |
| 6,098,161 A | 8/2000 | Kim et al. | |
| 6,106,625 A | 8/2000 | Koai et al. | |
| 6,110,267 A | 8/2000 | Aral et al. | |
| 6,120,640 A | 9/2000 | Shih et al. | |
| 6,123,791 A | 9/2000 | Han et al. | |
| 6,123,804 A | 9/2000 | Babassi et al. | |
| 6,129,808 A | 10/2000 | Wicker et al. | |
| 6,139,983 A | 10/2000 | Ohashi et al. | |
| 6,143,646 A | 11/2000 | Wetzel | |
| 6,170,429 B1 | 1/2001 | Schoepp et al. | |
| 6,176,969 B1 | 1/2001 | Park et al. | |
| 6,182,603 B1 | 2/2001 | Shang et al. | |
| 6,210,486 B1 | 4/2001 | Mizukami et al. | |
| 6,221,202 B1 | 4/2001 | Walko, II | |
| 6,246,479 B1 | 6/2001 | Jung et al. | |
| 6,264,788 B1 | 7/2001 | Tomoyasu et al. | |
| 6,265,757 B1 | 7/2001 | Brady et al. | |
| 6,266,133 B1 | 7/2001 | Miyajima et al. | |
| 6,296,740 B1 | 10/2001 | Xie et al. | |
| 6,335,293 B1 | 1/2002 | Luo et al. | |
| 6,364,949 B1 | 4/2002 | Or et al. | |
| 6,368,987 B1 | 4/2002 | Kopacz et al. | |
| 6,373,573 B1 | 4/2002 | Jung et al. | |
| 6,383,333 B1* | 5/2002 | Haino et al. | 156/345.1 |
| 6,383,964 B1* | 5/2002 | Nakahara et al. | 501/152 |
| 6,394,026 B1 | 5/2002 | Wicker et al. | |
| 6,444,083 B1 | 9/2002 | Steger et al. | |
| 6,514,377 B1 | 2/2003 | Morimoto | |
| 6,519,037 B1 | 2/2003 | Jung et al. | |
| 6,527,911 B1 | 3/2003 | Yen et al. | |
| 6,533,910 B1 | 3/2003 | O'Donnell et al. | |
| 6,537,429 B1 | 3/2003 | O'Donnell et al. | |
| 6,544,380 B1 | 4/2003 | Tomoyasu et al. | |
| 6,554,906 B1 | 4/2003 | Kuibira et al. | |
| 6,562,186 B1 | 5/2003 | Saito et al. | 156/345.24 |
| 6,570,654 B1 | 5/2003 | Jung et al. | |
| 6,583,064 B1 | 6/2003 | Wicker et al. | |
| 6,590,660 B1 | 7/2003 | Jung et al. | |
| 6,613,204 B1 | 9/2003 | Xie et al. | |
| 6,613,442 B1 | 9/2003 | O'Donnell et al. | |
| 6,641,697 B1 | 11/2003 | Han et al. | |
| 6,663,714 B1 | 12/2003 | Mizuno et al. | |
| 6,695,929 B1 | 2/2004 | Kanekiyo et al. | |
| 6,726,801 B1 | 4/2004 | Ahn | |
| 6,733,620 B1 | 5/2004 | Sugiyama et al. | |
| 6,738,862 B1 | 5/2004 | Ross et al. | |
| 6,776,873 B1 | 8/2004 | Sun et al. | |
| 6,783,863 B1 | 8/2004 | Harada et al. | |
| 6,783,875 B1 | 8/2004 | Yamada et al. | |
| 6,798,519 B1 | 9/2004 | Nishimoto et al. | |
| 6,805,952 B1 | 10/2004 | Chang et al. | |
| 6,806,949 B1 | 10/2004 | Ludviksson et al. | |
| 6,811,651 B1 | 11/2004 | Long | |
| 6,830,622 B1* | 12/2004 | O'Donnell et al. | 118/715 |
| 6,833,279 B1 | 12/2004 | Choi | |
| 6,837,966 B1 | 1/2005 | Nishimoto et al. | |
| 6,852,433 B1 | 2/2005 | Maeda | |
| 6,875,477 B1 | 4/2005 | Trickett et al. | |
| 6,884,516 B1 | 4/2005 | Harada et al. | |
| 6,894,769 B1 | 5/2005 | Ludviksson et al. | |
| 2001/0003271 A1* | 6/2001 | Otsuki | 118/723.001 |
| 2001/0050144 A1 | 12/2001 | Nishikawa et al. | |
| 2002/0076508 A1 | 6/2002 | Chiang et al. | |
| 2002/0086118 A1 | 7/2002 | Chang et al. | |
| 2002/0086501 A1 | 7/2002 | O'Donnell et al. | |
| 2002/0086545 A1 | 7/2002 | O'Donnell et al. | |
| 2002/0086553 A1 | 7/2002 | O'Donnell et al. | |
| 2002/0090464 A1 | 7/2002 | Jiang et al. | |
| 2002/0142611 A1 | 10/2002 | O'Donnell et al. | |
| 2002/0177001 A1 | 11/2002 | Harada et al. | 428/469 |
| 2003/0010445 A1 | 1/2003 | Kajiyama et al. | |
| 2003/0029563 A1 | 2/2003 | Kaushai et al. | |
| 2003/0084848 A1 | 5/2003 | Long | |
| 2003/0113479 A1 | 6/2003 | Fakuda et al. | 427/569 |
| 2003/0200929 A1 | 10/2003 | Otsuki | |
| 2004/0026372 A1 | 2/2004 | Takenaka et al. | |
| 2004/0035364 A1 | 2/2004 | Tomoyoshi et al. | |
| 2004/0050495 A1 | 3/2004 | Sumiya et al. | |
| 2004/0060516 A1 | 4/2004 | Nishimoto et al. | |
| 2004/0060656 A1 | 4/2004 | Saigusa et al. | |
| 2004/0060657 A1 | 4/2004 | Saigusa et al. | |
| 2004/0060658 A1 | 4/2004 | Nishimoto et al. | |
| 2004/0060661 A1 | 4/2004 | Nishimoto et al. | |
| 2004/0061447 A1 | 4/2004 | Saigusa et al. | |
| 2004/0063333 A1 | 4/2004 | Saigusa et al. | |
| 2004/0072426 A1 | 4/2004 | Jung | |
| 2004/0081746 A1 | 4/2004 | Imafuku | |
| 2004/0083970 A1 | 5/2004 | Imafuku et al. | |
| 2004/0125359 A1 | 7/2004 | Ludviksson et al. | |
| 2004/0168640 A1 | 9/2004 | Muto et al. | |
| 2004/0173155 A1 | 9/2004 | Nishimoto et al. | |
| 2004/0216667 A1 | 11/2004 | Mitsuhashi et al. | |
| 2005/0103268 A1 | 5/2005 | Nishimoto et al. | |
| 2005/0103275 A1 | 5/2005 | Sasaki et al. | |
| 2005/0150866 A1 | 7/2005 | O'Donnell | 216/67 |

FOREIGN PATENT DOCUMENTS

| | | |
|---|---|---|
| EP | 0 508 731 | 10/1992 |
| EP | 0 573 057 | 12/1993 |
| EP | 0 799 904 | 10/1997 |
| EP | 0 814 495 A2 | 12/1997 |
| EP | 0 841 838 A1 | 5/1998 |
| EP | 1 069 603 | 1/2001 |
| EP | 1 081 749 | 7/2001 |
| EP | 1 156 130 A1 | 11/2001 |
| GB | 2 252 567 | 8/1992 |
| JP | 61-207566 | 9/1986 |
| JP | 64-039728 | 2/1989 |
| JP | 1-312087 | 12/1989 |
| JP | 02-267967 | 11/1990 |
| JP | 03-115535 | 5/1991 |
| JP | 4-238882 | 8/1992 |
| JP | 05-070922 | 3/1993 |
| JP | 05-117064 | 5/1993 |
| JP | 05-121360 | 5/1993 |
| JP | 05-198532 | 8/1993 |
| JP | 05-238859 | 9/1993 |
| JP | 06-057396 | 3/1994 |
| JP | 06-136505 | 5/1994 |

| | | |
|---|---|---|
| JP | 06-142822 | 5/1994 |
| JP | 06-256926 | 9/1994 |
| JP | 07-058013 A | 3/1995 |
| JP | 07-126827 | 5/1995 |
| JP | 07-176524 | 7/1995 |
| JP | 07-226378 | 8/1995 |
| JP | 07-245295 | 9/1995 |
| JP | 08-037180 | 2/1996 |
| JP | 08-041309 | 2/1996 |
| JP | 08-081777 | 3/1996 |
| JP | 08-268751 | 10/1996 |
| JP | 08-339895 | 12/1996 |
| JP | 09-069554 | 3/1997 |
| JP | 09-272987 | 10/1997 |
| JP | 10-004083 | 1/1998 |
| JP | 10-045461 | 2/1998 |
| JP | 10-045467 | 2/1998 |
| JP | 10-130884 | 5/1998 |
| JP | 10-214819 | 8/1998 |
| JP | 10-251871 | 9/1998 |
| JP | 11-080925 | 3/1999 |
| JP | 11-207161 | 8/1999 |
| JP | 11-233292 | 8/1999 |
| JP | 11-312646 | 11/1999 |
| JP | 2000-124197 | 4/2000 |
| JP | 2000-303180 | 10/2000 |
| JP | 2001-031484 | 2/2001 |
| JP | 2001-152307 | 6/2001 |
| JP | 2001-164354 | 6/2001 |
| JP | 2001-226773 | 8/2001 |
| JP | 2002-151473 | 5/2002 |
| JP | 2002151473 A * | 5/2002 |
| KR | 1999-008142 | 1/1999 |
| KR | 10/2004-0007601 | 1/2004 |
| WO | WO 99/50886 | 10/1999 |
| WO | WO 01/42526 | 6/2001 |
| WO | 02/39495 | 5/2002 |
| WO | 02/48421 | 6/2002 |
| WO | WO 2004/030011 | 4/2004 |
| WO | WO 2004/030012 | 4/2004 |
| WO | WO 2004/030013 | 4/2004 |
| WO | WO 2004/030014 | 4/2004 |
| WO | WO 2004/030015 | 4/2004 |
| WO | WO 2004/030020 | 4/2004 |
| WO | WO 2004/030426 | 4/2004 |
| WO | WO 2004/095530 | 11/2004 |
| WO | WO 2004/095532 | 11/2004 |

OTHER PUBLICATIONS

Production drawing for Deposition Shield believed to be sold in the U.S. prior to Sep. 30, 2001.
Production drawing for Upper Electrode believed to be sold in the U.S. prior to Sep. 30, 2001.
JIS Using Series, "Spraying Techniques Manual.", p. 95 (Oct. 30, 1998, Japanese Standard Association), with English Abstract.

* cited by examiner

METHOD AND APPARATUS FOR AN IMPROVED DEPOSITION SHIELD IN A PLASMA PROCESSING SYSTEM

CROSS-REFERENCE TO RELATED APPLICATIONS

This application is related to co-pending U.S. patent application Ser. No. 10/259,858, entitled "Method and apparatus for an improved upper electrode plate with deposition shield in a plasma processing system", co-pending U.S. patent application Ser. No. 10/259,392, entitled "Method and apparatus for an improved baffle plate in a plasma processing system", co-pending U.S. patent application Ser. No. 10/259,380, entitled "Method and apparatus for an improved baffle plate in a plasma processing system", co-pending U.S. patent application Ser. No. 10/259,757, entitled "Method and apparatus for an improved upper electrode plate in a plasma processing system", co-pending U.S. patent application Ser. No. 10/259,352, entitled "Method and apparatus for an improved optical window deposition shield in a plasma processing system", and co-pending U.S. patent application Ser. No. 10/259,306, entitled "Method and apparatus for an improved bellows shield in a plasma processing system". The entire contents of all of those applications are herein incorporated by reference in their entirety.

FIELD OF THE INVENTION

The present invention relates to an improved component for a plasma processing system and, more particularly, to a deposition shield employed in a plasma processing system for protecting a chamber wall.

BACKGROUND OF THE INVENTION

The fabrication of integrated circuits (IC) in the semiconductor industry typically employs plasma to create and assist surface chemistry within a plasma reactor necessary to remove material from and deposit material to a substrate. In general, plasma is formed within the plasma reactor under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the chamber (e.g., etching processes where materials are removed from the substrate or deposition processes where materials are added to the substrate).

Although the formation of a population of charged species (ions, etc.) and chemically reactive species is necessary for performing the function of the plasma processing system (i.e. material etch, material deposition, etc.) at the substrate surface, other component surfaces on the interior of the processing chamber are exposed to the physically and chemically active plasma and, in time, can erode. The erosion of exposed components in the plasma processing system can lead to a gradual degradation of the plasma processing performance and ultimately to complete failure of the system.

In order to minimize the damage sustained by exposure to the processing plasma, components of the plasma processing system, known to sustain exposure to the processing plasma, are coated with a protective barrier. For example, components fabricated from aluminum can be anodized to produce a surface layer of aluminum oxide, which is more resistant to the plasma. In another example, a consumable or replaceable component, such as one fabricated from silicon, quartz, alumina, carbon, or silicon carbide, can be inserted within the processing chamber to protect the surfaces of more valuable components that would impose greater costs during frequent replacement. Furthermore, it is desirable to select surface materials that minimize the introduction of unwanted contaminants, impurities, etc. to the processing plasma and possibly to the devices formed on the substrate.

In both cases, the inevitable failure of the protective coating, either due to the integrity of the protective barrier or the integrity of the fabrication of the protective barrier, and the consumable nature of the replaceable components demands frequent maintenance of the plasma processing system. This frequent maintenance can produce costs associated with plasma processing down-time and new plasma processing chamber components, which can be excessive.

SUMMARY OF THE INVENTION

The present invention provides an improved deposition shield for surrounding a process space in a plasma processing system, wherein the design and fabrication of the deposition shield advantageously addresses the above-identified shortcomings.

It is an object of the present invention to provide a deposition shield that can be coupled to the plasma processing system comprising a cylinder having an inner surface, an outer surface, an upper end surface, and a lower end surface. The lower end surface can further comprise an end lip surface.

It is another object of the present invention to further provide a deposition shield comprising a plurality of fastening receptors, each coupled to the upper end surface and the lower end surface of the deposition shield and configured to attach the deposition shield to the plasma processing system.

It is another object of the present invention to further provide a deposition shield comprising an opening for enabling access to the process space through the deposition shield. The opening can comprise a first opening surface, a second opening surface, and a mating surface, wherein the mating surface can comprise one or more tapped holes comprising a fastening surface.

It is another object of the present invention that the deposition shield further comprises a protective barrier formed on a plurality of exposed surfaces of the deposition shield facing the processing plasma.

It is a further object of the present invention that the exposed surfaces of the deposition shield comprise the inner surface of the deposition shield, the upper end surface of the deposition shield, and the end lip surface of the lower end surface of the deposition shield.

It is a further object of the present invention that the deposition shield can comprise additional exposed surfaces such as the first opening surface of the opening, and the mating surface excluding the fastening surface of the opening in the deposition shield.

The present invention further provides a method of producing the deposition shield in the plasma processing system comprising the steps: fabricating the deposition shield; anodizing the deposition shield to form a surface anodization layer on the deposition shield; machining exposed surfaces on the deposition shield to remove the surface anodization layer; and forming a protective barrier on the exposed surfaces of the deposition shield.

The present invention provides another method of producing the deposition shield in the plasma processing system comprising the steps: fabricating the deposition shield; masking the exposed surfaces on the deposition shield to prevent formation of a surface anodization layer; anodizing the deposition shield to form the surface anodization layer on the deposition shield; and forming a protective barrier on the exposed surfaces of the deposition shield.

The present invention provides another method of producing the deposition shield in the plasma processing system comprising the steps: fabricating the deposition shield; and forming a protective barrier on the exposed surfaces of the deposition shield.

The present invention may optionally include machining other parts not actually exposed to the plasma. Such parts may be machined in order to provide a contact free from the anodization layer (e.g., in order to provide a better mechanical or electrical contact).

The present invention may optionally include masking of other parts not actually exposed to the plasma. Such parts may be masked in order to provide a contact free from the anodization layer (e.g., in order to provide a better mechanical or electrical contact).

The present invention also provides a combined method of machining and masking to provide bare exposed surfaces on which to form the protective barrier.

BRIEF DESCRIPTION OF THE DRAWINGS

These and other advantages of the invention will become more apparent and more readily appreciated from the following detailed description of the exemplary embodiments of the invention taken in conjunction with the accompanying drawings, where.

DETAILED DESCRIPTION OF AN EMBODIMENT

Figure 1:
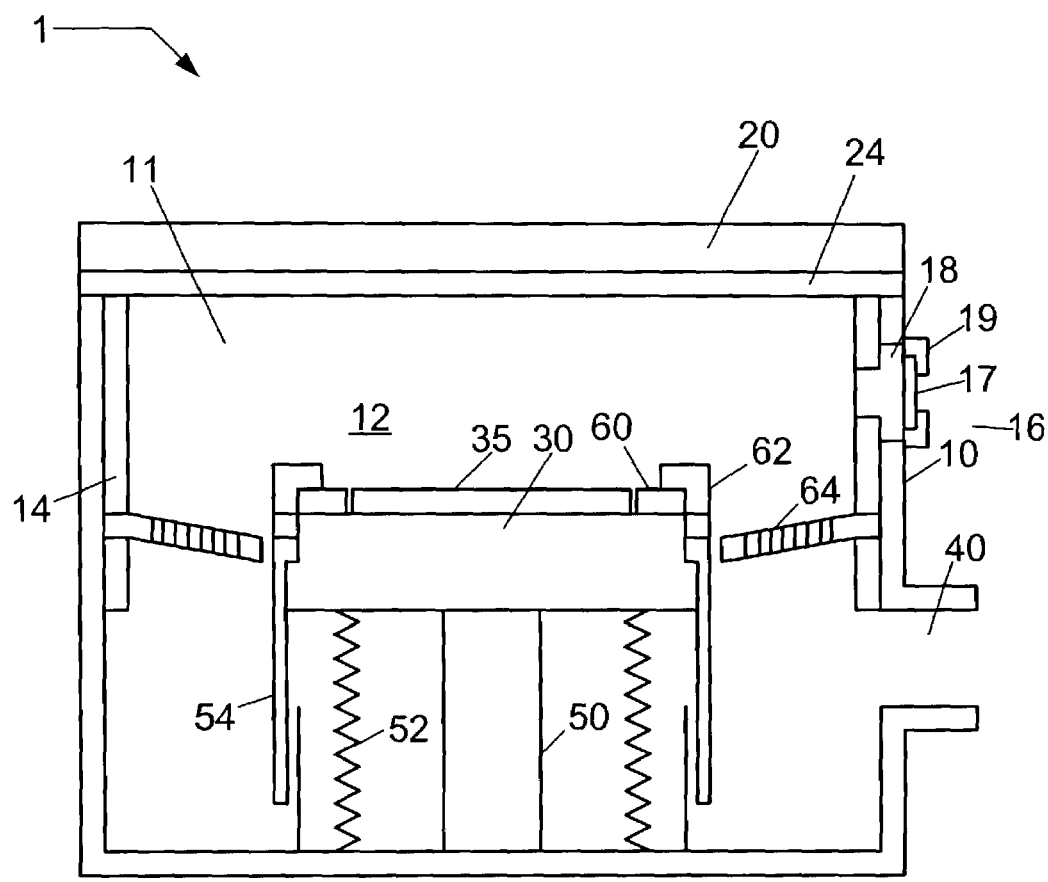
FIG. 1 shows a simplified block diagram of a plasma processing system comprising a deposition shield according to an embodiment of the present invention.

According to an embodiment of the present invention, a plasma processing system 1 is depicted in FIG. 1 comprising a plasma processing chamber 10, an upper assembly 20, an electrode plate 24, a substrate holder 30 for supporting a substrate 35, and a pumping duct 40 coupled to a vacuum pump (not shown) for providing a reduced pressure atmosphere 11 in plasma processing chamber 10. Plasma processing chamber 10 can facilitate the formation of a processing plasma in a process space 12 adjacent substrate 35. The plasma processing system 1 can be configured to process 200 mm substrates, 300 mm substrates, or larger.

In the illustrated embodiment, upper assembly 20 can comprise at least one of a cover, a gas injection assembly, and an upper electrode impedance match network. For example, the electrode plate 24 can be coupled to an RF source. In another alternate embodiment, the upper assembly 20 comprises a cover and an electrode plate 24, wherein the electrode plate 24 is maintained at an electrical potential equivalent to that of the plasma processing chamber 10. For example, the plasma processing chamber 10, the upper assembly 20, and the electrode plate 24 can be electrically connected to ground potential.

Plasma processing chamber 10 can, for example, further comprise a deposition shield 14 for protecting the plasma processing chamber 10 from the processing plasma in the process space 12, and an optical viewport 16. Optical viewport 16 can comprise an optical window 17 coupled to the backside of an optical window deposition shield 18, and an optical window flange 19 can be configured to couple optical window 17 to the optical window deposition shield 18. Sealing members, such as O-rings, can be provided between the optical window flange 19 and the optical window 17, between the optical window 17 and the optical window deposition shield 18, and between the optical window deposition shield 18 and the plasma processing chamber 10. Optical viewport 16 can, for example, permit monitoring of optical emission from the processing plasma in process space 12.

Substrate holder 30 can, for example, further comprise a vertical translational device 50 surrounded by a bellows 52 coupled to the substrate holder 30 and the plasma processing chamber 10, and configured to seal the vertical translational device 50 from the reduced pressure atmosphere 11 in plasma processing chamber 10. Additionally, a bellows shield 54 can, for example, be coupled to the substrate holder 30 and configured to protect the bellows 52 from the processing plasma. Substrate holder 10 can, for example, further be coupled to at least one of a focus ring 60, and a shield ring 62. Furthermore, a baffle plate 64 can extend about a periphery of the substrate holder 30.

Substrate 35 can be, for example, transferred into and out of plasma processing chamber 10 through a slot valve (not shown) and chamber feed-through (not shown) via robotic substrate transfer system where it is received by substrate lift pins (not shown) housed within substrate holder 30 and mechanically translated by devices housed therein. Once substrate 35 is received from substrate transfer system, it is lowered to an upper surface of substrate holder 30.

Substrate 35 can be, for example, affixed to the substrate holder 30 via an electrostatic clamping system. Furthermore, substrate holder 30 can, for example, further include a cooling system including a re-circulating coolant flow that receives heat from substrate holder 30 and transfers heat to a heat exchanger system (not shown), or when heating, transfers heat from the heat exchanger system. Moreover, gas can, for example, be delivered to the back-side of substrate 35 via a backside gas system to improve the gas-gap thermal conductance between substrate 35 and substrate holder 30. Such a system can be utilized when temperature control of the substrate is required at elevated or reduced temperatures. In other embodiments, heating elements, such as resistive heating elements, or thermo-electric heaters/coolers can be included.

In the illustrated embodiment, shown in FIG. 1, substrate holder 30 can comprise an electrode through which RF power is coupled to the processing plasma in process space 12. For example, substrate holder 30 can be electrically biased at a RF voltage via the transmission of RF power from a RF generator (not shown) through an impedance match network (not shown) to substrate holder 30. The RF bias can serve to heat electrons to form and maintain plasma. In this configuration, the system can operate as a reactive ion etch (RIE) reactor, wherein the chamber and upper gas injection electrode serve as ground surfaces. A typical frequency for the RF bias can range from 1 MHz to 100 MHz and is preferably 13.56 MHz. RF systems for plasma processing are well known to those skilled in the art.

Alternately, the processing plasma formed in process space 12 can be formed using a parallel-plate, capacitively coupled plasma (CCP) source, an inductively coupled plasma (ICP) source, any combination thereof, and with and without DC magnet systems. Alternately, the processing plasma in process space 12 can be formed using electron cyclotron resonance (ECR). In yet another embodiment, the processing plasma in process space 12 is formed from the launching of a Helicon wave. In yet another embodiment, the processing plasma in process space 12 is formed from a propagating surface wave.

Figure 2:
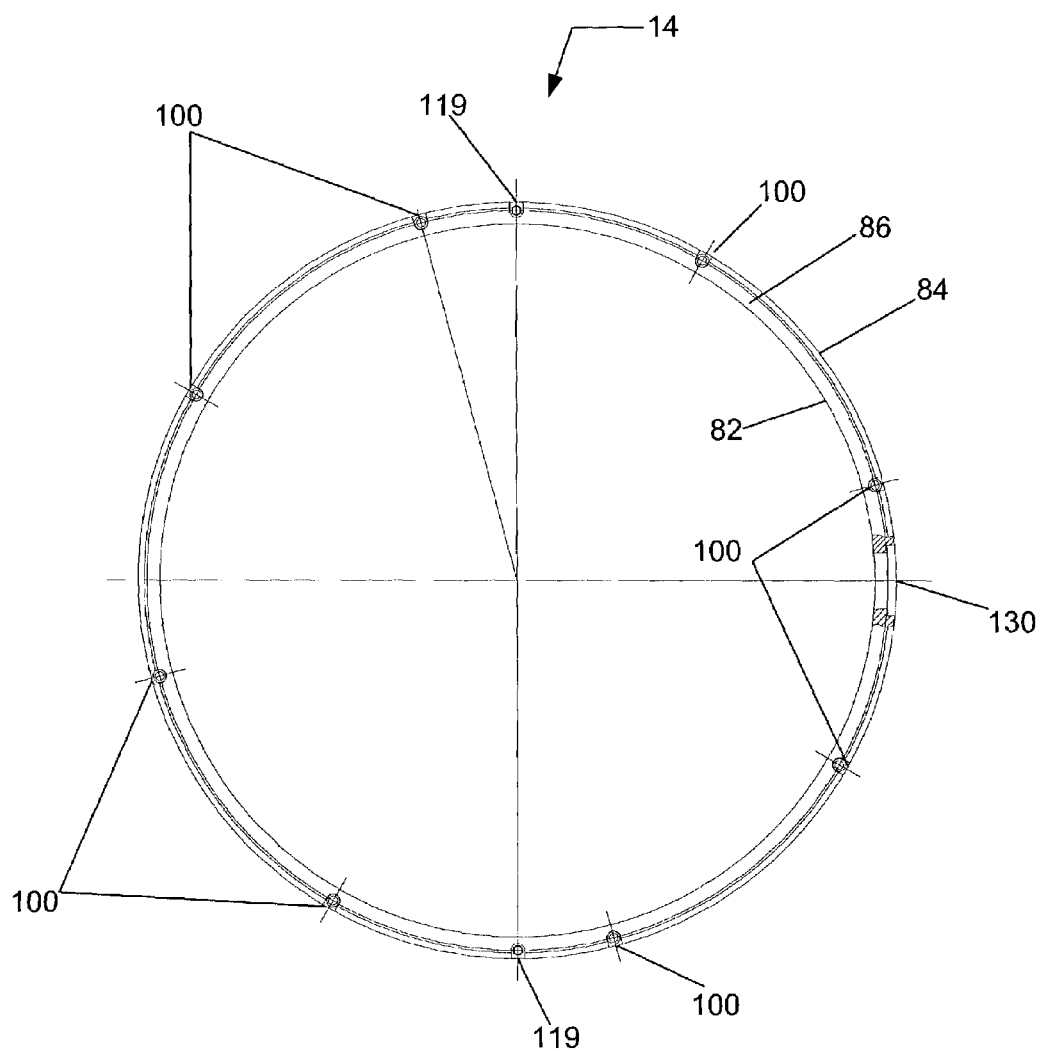
FIG. 2 shows a plan view of a deposition shield for a plasma processing system according to an embodiment of the present invention.
Figure 3:
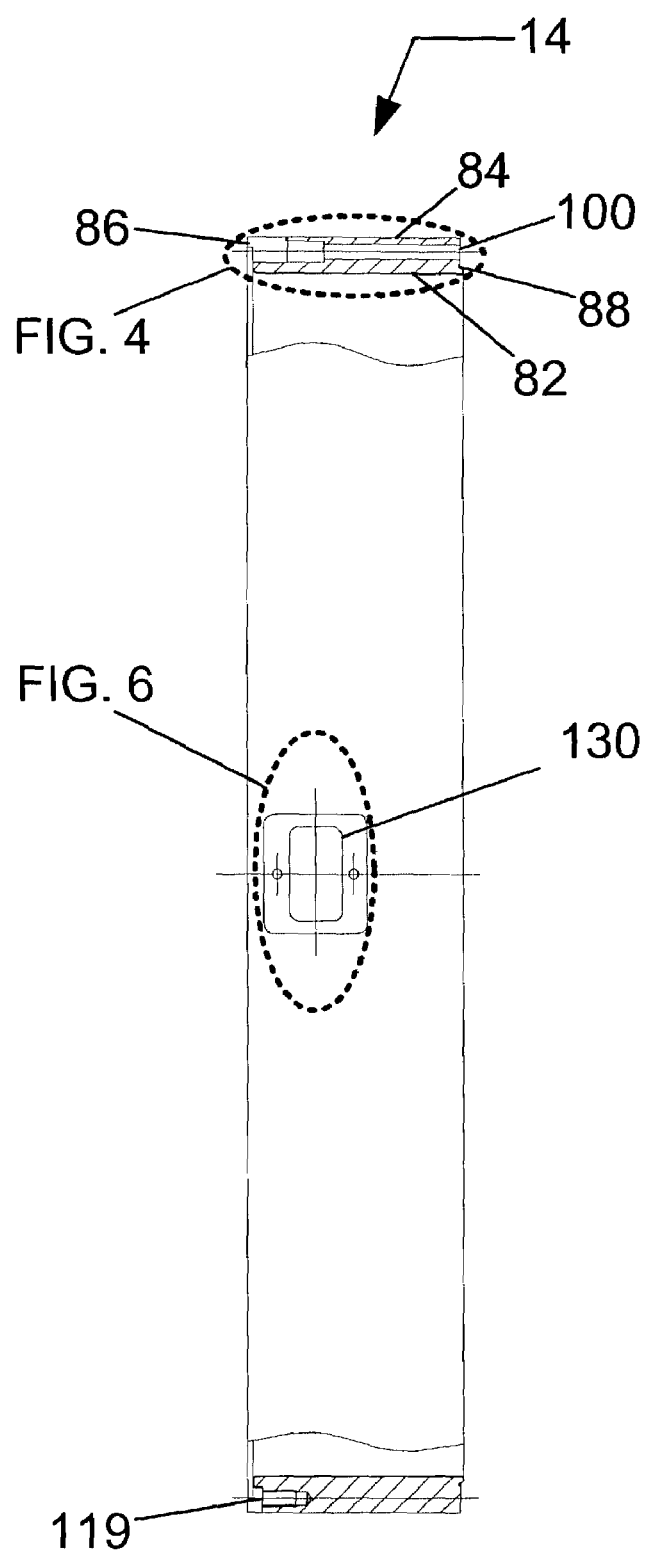
FIG. 3 shows a partial cross sectional view of a deposition shield for a plasma processing system according to an embodiment of the present invention.

Referring now to an illustrated embodiment of the present invention depicted in FIGS. 2 (plan view) and 3 (partial cross sectional view), deposition shield 14 can comprise a cylinder having an inner surface 82, an outer surface 84, an upper end surface 86, and a lower end surface 88. Furthermore, for example, a thickness of the deposition shield 14, dictated by the distance from the inner surface 82 to the outer surface 84 of the deposition shield 14, can range from 1 to 50 mm. Desirably, the thickness can range from 5 to 20 mm, and, preferably, the thickness is at least 10 mm.

Figure 4:
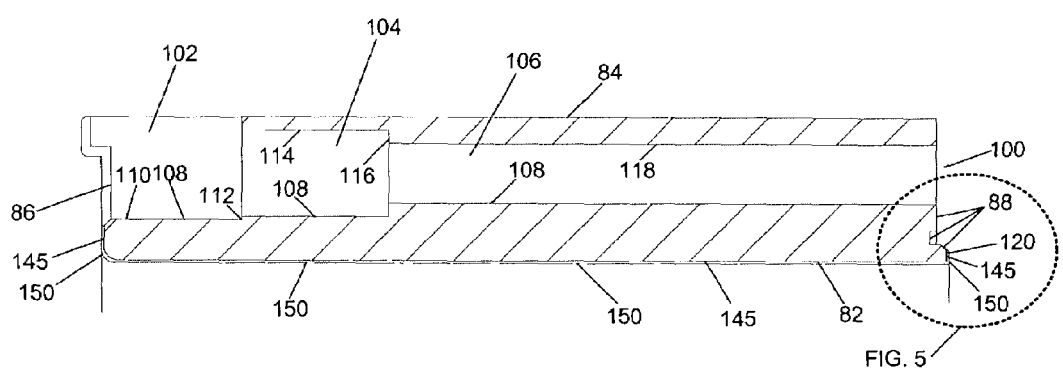
FIG. 4 shows an expanded cross sectional view of a deposition shield for a plasma processing system according to an embodiment of the present invention.

Deposition shield 14 can, for example, further comprise a plurality of fastening receptors 100, each fastening receptor 100 coupled to the upper end surface 86 and the lower end surface 88, and configured to receive fastening devices (such as bolts) (not shown) to couple deposition shield 14 to plasma processing system 1. FIG. 4 shows an expanded cross sectional view of deposition shield 14 and one of the plurality of fastening receptors 100. The fastening receptors 100 can comprise an entrant region 102, an entrant cavity 104, an exit through-hole 106, and an interior fastener surface 108. Furthermore, the interior fastener surface 108 can, for example, comprise a first entrant surface 110, a first lip surface 112, a second entrant surface 114, a second lip surface 116, and an exit surface 118. For example, the number of fastening receptors 100 formed within deposition shield 14 can range from 0 to 100. Desirably, the number of fastening receptors 100 can range from 5 to 20; and, preferably, the number of fastening receptors 100 is at least 8.

Additionally, deposition shield 14 can, for example, comprise one or more tapped receptor holes 119 configured to receive a fastening device (such as a bolt) (not shown) and configured to couple deposition shield 14 with a component of the plasma processing chamber 10 such as the upper assembly 20. For example, the number of tapped receptor holes 119 formed within deposition shield 14 can range from 0 to 20. Desirably, the number of tapped receptor holes 119 can range from 1 to 10; and, preferably, the number of tapped receptor holes 119 is at least 2.

Figure 5:
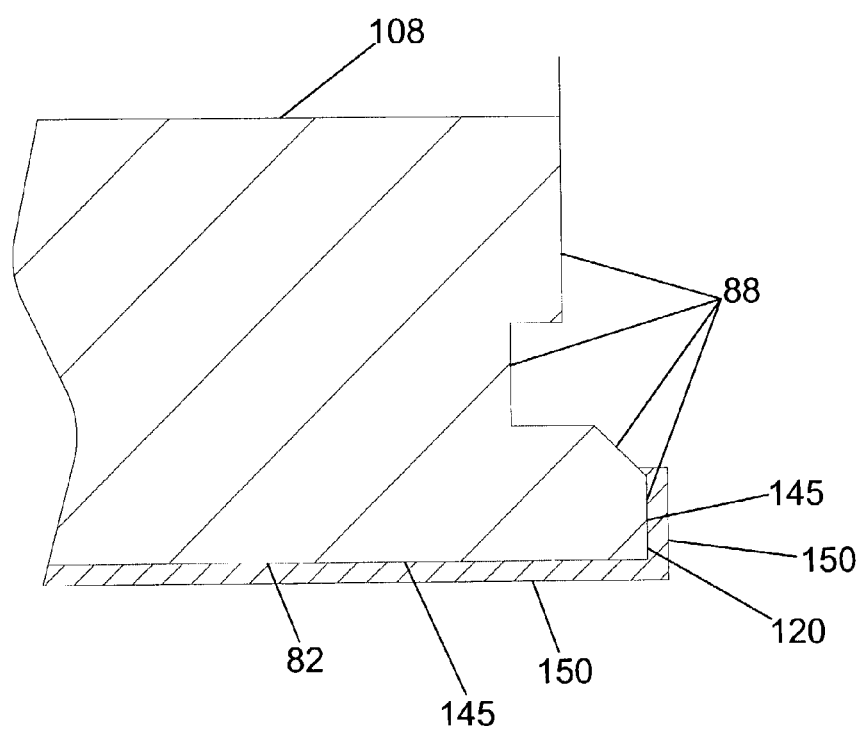
FIG. 5 shows an expanded view of a lower end surface of a deposition shield for a plasma processing system according to an embodiment of the present invention.

FIG. 5 provides an expanded view of the lower end surface 88 of the deposition shield 14, wherein the lower end surface 88 further comprises an end lip surface 120 as shown.

Referring again to FIG. 2, deposition shield 14 can, for example, further comprise an opening 130 in order to accommodate access to the process space 12 through deposition shield 14. In an embodiment of the present invention, the opening 130 is not formed in deposition shield 14. In an alternate embodiment, the opening 130 is formed in deposition shield 14 to accommodate the insertion of at least one of a deposition shield plug (not shown) or an optical window deposition shield such as the one depicted in FIG. 1. For further details, co-pending U.S. patent application Ser. No. 10/259,352, entitled "Method and apparatus for an improved optical window deposition shield in a plasma processing system".

Figure 6:
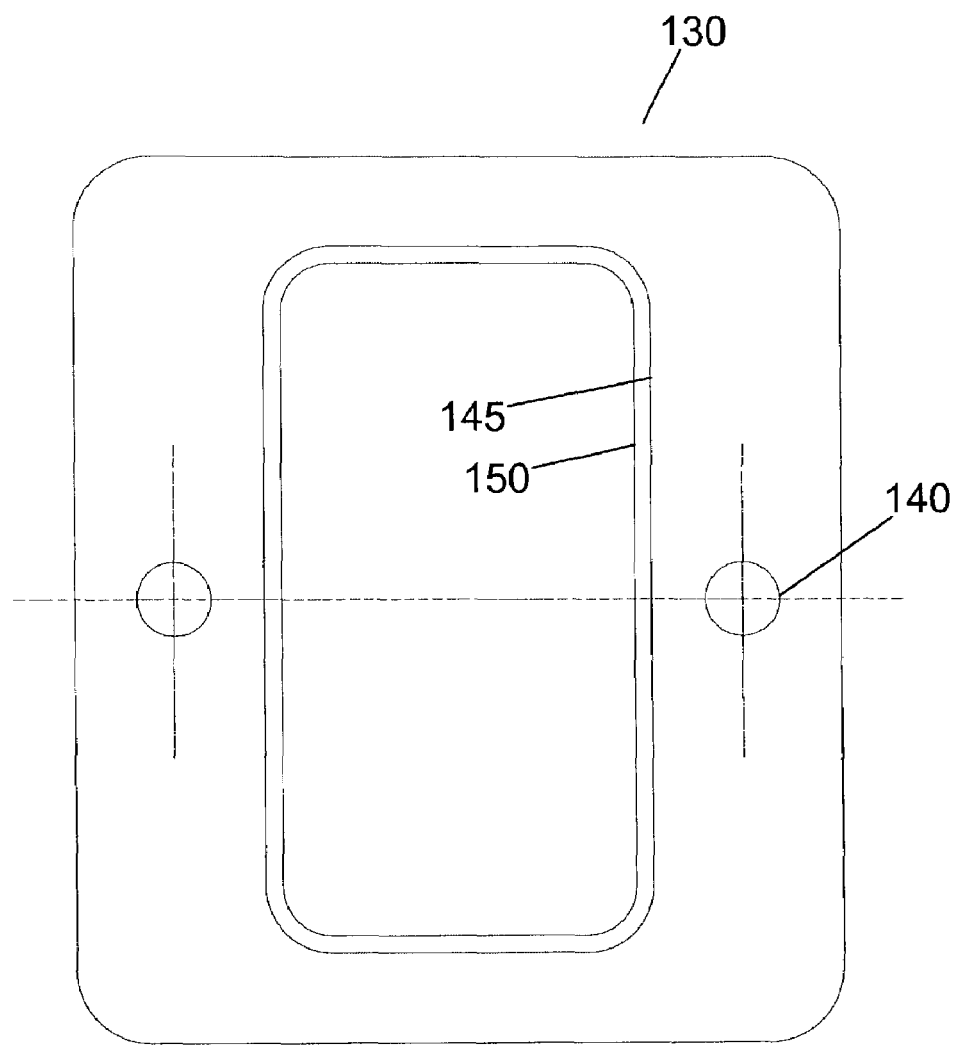
FIG. 6 presents an expanded view of an opening in a deposition shield for a plasma processing system according to an embodiment of the present invention.
Figure 7:
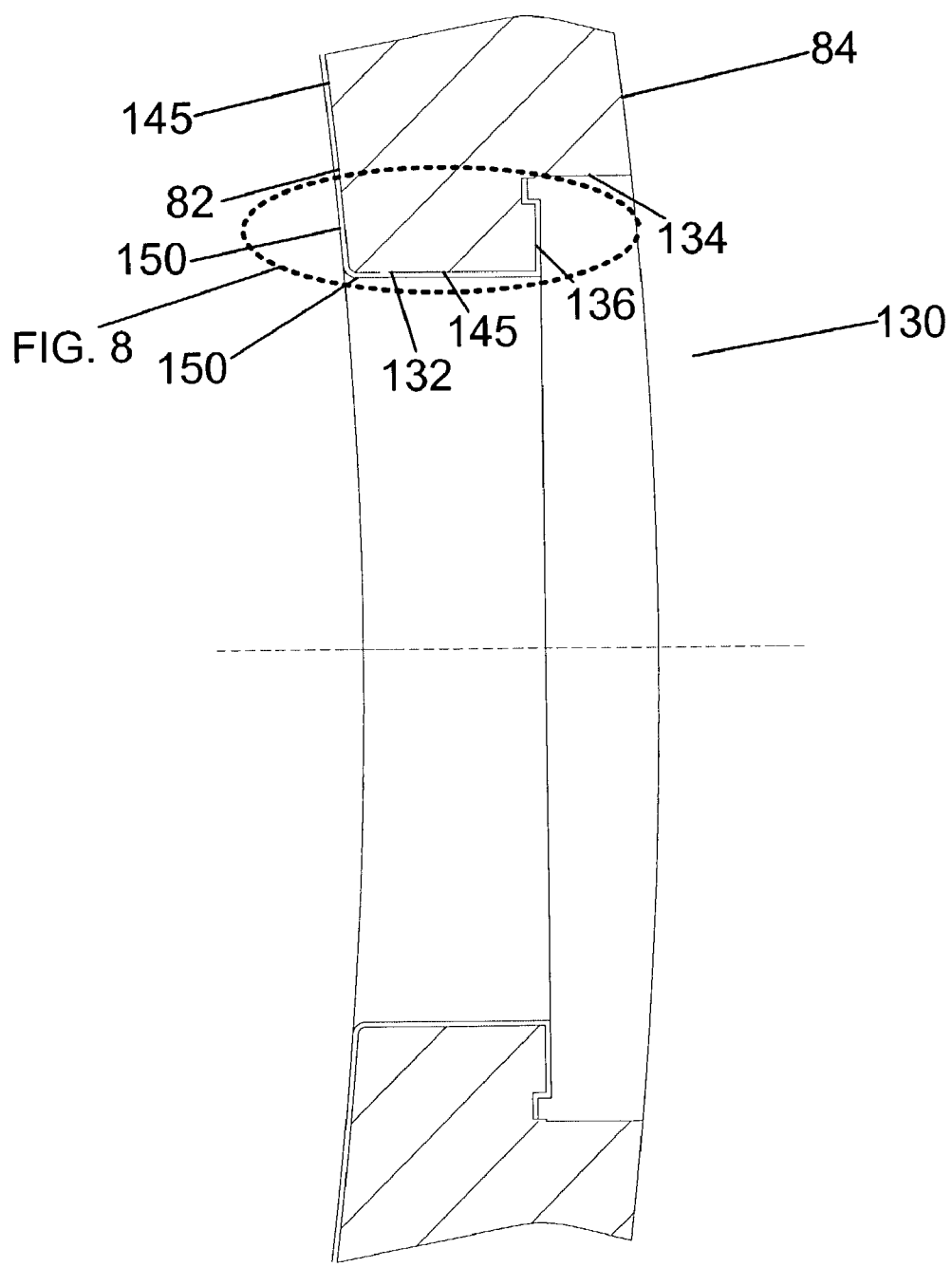
FIG. 7 presents an expanded cross sectional view of an opening taken along a major axis of the opening for a plasma processing system according to an embodiment of the present invention.
Figure 8:
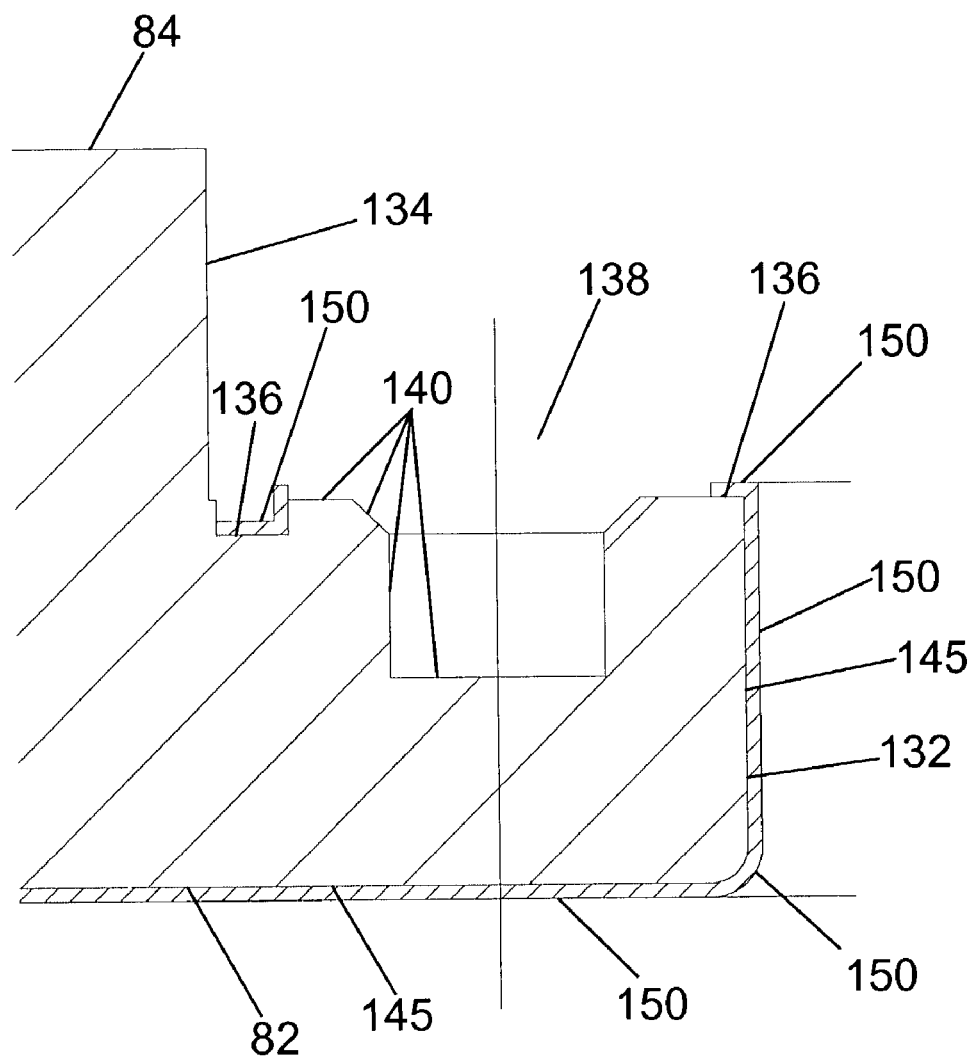
FIG. 8 shows a cross sectional view of a mating surface and a fastening surface of an opening for a plasma processing system according to another embodiment of the present invention.

In FIGS. 6 and 7, an expanded view of opening 130 in deposition shield 14 and a cross sectional view of opening 130, taken along a major axis of opening 130, respectively, are presented. As depicted in FIG. 7, opening 130 can further comprise a first opening surface 132 coupled to the inner surface 82 of the deposition shield 14, a second opening surface 134 coupled to the outer surface 84 of the deposition shield 14, and a mating surface 136 coupled to the first opening surface 132 and to the second opening surface 134. In addition, the mating surface 136 can comprise at least one tapped hole 138 for receiving a threaded fastener (not shown) in order to couple at least one of the chamber plug (not shown) or the optical window deposition shield (not shown) to the deposition shield 14. As shown in FIG. 8, the mating surface 136 further comprises a fastening surface 140 immediately adjacent to and extending within the tapped hole 138. Furthermore, for example, a width (along a major axis) of the opening 130 can range from 1 to 100 mm. Desirably, the width can range from 10 to 40 mm, and, preferably, the width is at least 25 mm. Furthermore, for example, a height (along a minor axis) of the opening 130 can range from 1 to 100 mm. Desirably, the height can range from 10 to 40 mm, and, preferably, the height is at least 15 mm.

Referring now to FIGS. 2 through 8, the deposition shield 14 further comprises a protective barrier 150 formed on a plurality of exposed surfaces 145 of the deposition shield 14. In an embodiment of the present invention, the exposed surfaces 145 can comprise the inner surface 82 of deposition shield 14, the upper end surface 86 of deposition shield 14, and the end lip surface 120 of the lower end surface 88 of deposition shield 14. Alternately, the exposed surfaces can further comprise the first opening surface 132 of opening 130, and the mating surface 136 excluding the fastening surface 140 of opening 130.

In an embodiment of the present invention, the protective barrier 150 can comprise a compound including an oxide of aluminum such as $Al_2O_3$. In another embodiment of the present invention, the protective barrier 150 can comprise a mixture of $Al_2O_3$ and $Y_2O_3$. In another embodiment of the present invention, the protective barrier 150 can comprise at least one of a III-column element (column III of periodic table) and a Lanthanon element. In another embodiment of the present invention, the III-column element can comprise at least one of Yttrium, Scandium, and Lanthanum. In another embodiment of the present invention, the Lanthanon element can comprise at least one of Cerium, Dysprosium, and Europium. In another embodiment of the present invention, the compound forming protective barrier 150 can comprise at least one of Yttria ($Y_2O_3$), $Sc_2O_3$, $Sc_2F_3$, $YF_3$, $La_2O_3$, $CeO_2$, $Eu_2O_3$, and $DyO_3$.

In an embodiment of the present invention, the protective barrier 150 formed on deposition shield 14 comprises a minimum thickness, wherein the minimum thickness can be specified as constant across at least one of the exposed surfaces 145. In another embodiment, the minimum thickness can be variable across the exposed surfaces 145. Alternately, the minimum thickness can be constant over a first portion of an exposed surface and variable over a second portion of an exposed surface. For example, a variable thickness can occur on a curved surface, on a corner, or in a hole. For example, the minimum thickness can range from 0.5 micron to 500 micron. Desirably, the minimum thickness can range from 100 micron to 200 micron, and, preferably, the minimum thickness is at least 120 micron.

Figure 9:
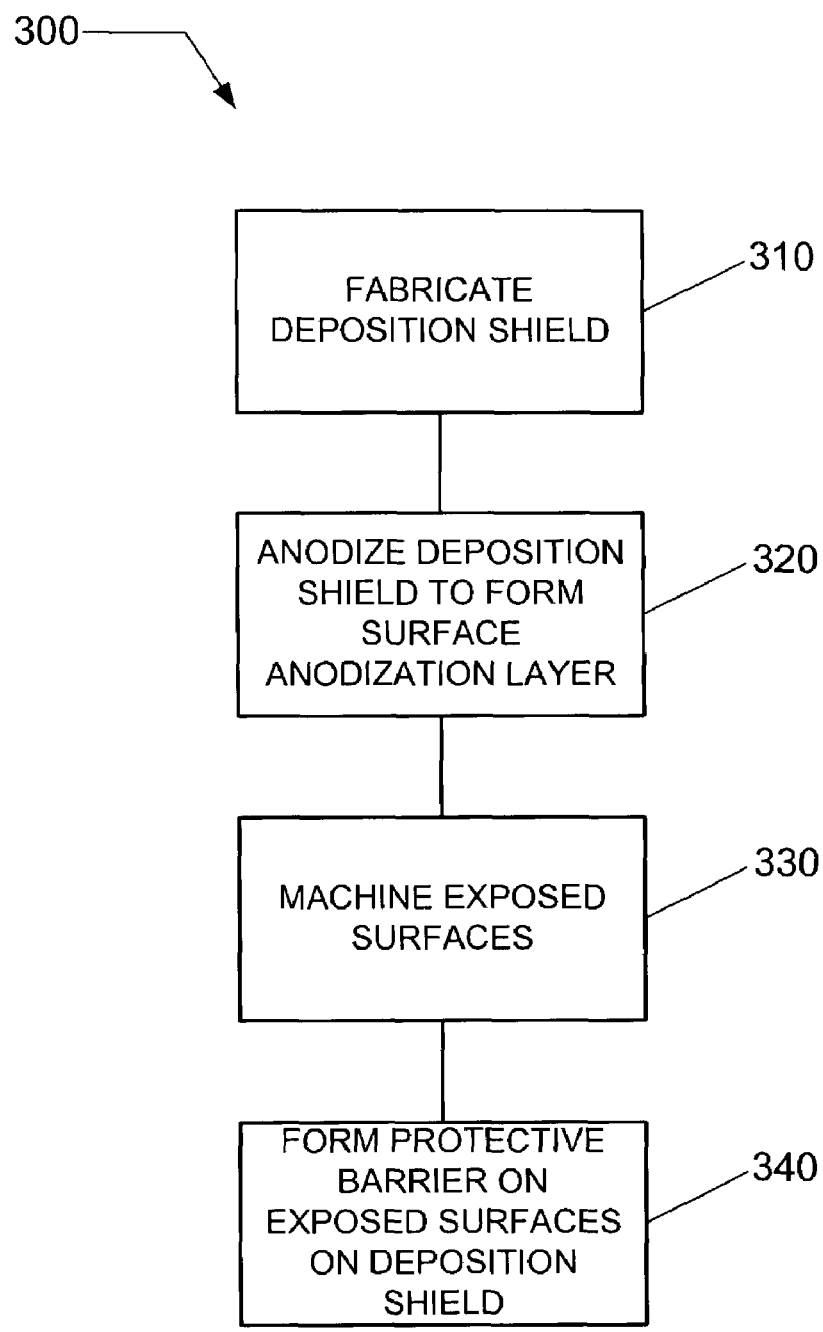
FIG. 9 presents a method of producing a deposition shield for a plasma processing system according to an embodiment of the present invention.

FIG. 9 presents a method of producing the deposition shield in the plasma processing system described in FIG. 1 according to an embodiment of the present invention. A flow diagram 300 begins in 310 with fabricating the deposition shield 14 (as described above). Fabricating the deposition shield can comprise at least one of machining, casting, polishing, forging, and grinding. For example, each of the elements described above can be machined according to specifications set forth on a mechanical drawing, using conventional techniques including a mill, a lathe, etc. The techniques for machining a component using, for example, a mill or a lathe, are well known to those skilled in the art of machining. The deposition shield can, for example, be fabricated from aluminum.

In 320, the deposition shield is anodized to form a surface anodization layer. For example, when fabricating the deposition shield from aluminum, the surface anodization layer can comprise aluminum oxide ($Al_2O_3$). Methods of anodizing aluminum components are well known to those skilled in the art of surface anodization.

In 330, the surface anodization layer is removed from the exposed surfaces 145 using standard machining techniques. In an embodiment of the present invention, the exposed surfaces comprise the inner surface of the deposition shield, the upper end surface of the deposition shield, and the end lip surface of the lower end surface of the deposition shield. Alternately, the exposed surfaces can further comprise the first opening surface of the opening, and the mating surface excluding the fastening surface of the opening in the deposition shield. In this step, or in a separate step, additional non-exposed surfaces may also be machined. Such non-exposed surfaces may be machined in order to provide better mechanical or electrical contacts between those parts and the parts with which they are mated.

In 340, a protective barrier is formed on the exposed surfaces 145. A protective barrier comprising, for example Yttria, can be formed using (thermal) spray coating techniques that are well known to those skilled in the art of ceramic spray coatings. In an alternate embodiment, forming the protective barrier can further comprise polishing (or smoothing) the thermal spray coating. For example, polishing the thermal spray coating can comprise the application of sand paper to the sprayed surfaces.

Figure 10:
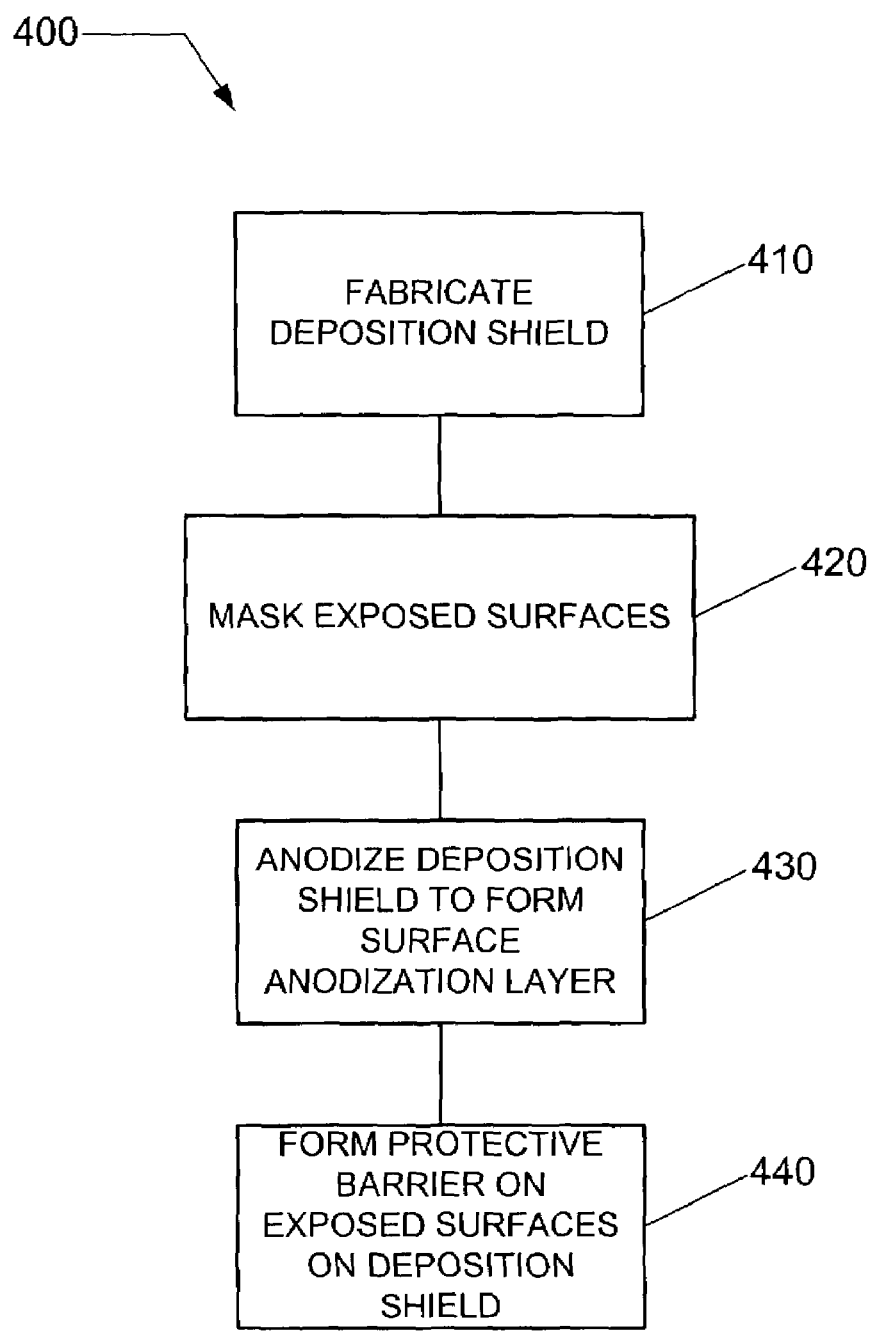
FIG. 10 presents a method of producing a deposition shield for a plasma processing system according to another embodiment of the present invention.

FIG. 10 presents a method of producing the deposition shield in the plasma processing system described in FIG. 1 according to another embodiment of the present invention. A flow diagram 400 begins in 410 with fabricating the deposition shield 14 (as described above). Fabricating the deposition shield can comprise at least one of machining, casting, polishing, forging, and grinding. For example, each of the elements described above can be machined according to specifications set forth on a mechanical drawing, using conventional techniques including a mill, a lathe, etc. The techniques for machining a component using, for example, a mill or a lathe, are well known to those skilled in the art of machining. The deposition shield can, for example, be fabricated from aluminum.

In 420, exposed surfaces are masked to prevent the formation of a surface anodization layer thereon. In this step, or in a separate step, additional non-exposed surfaces may be masked. Such non-exposed surfaces may be masked in order to provide better mechanical or electrical contacts between those parts and the parts with which they are mated. Techniques for surface masking and unmasking are well known to those skilled in the art of surface coatings and surface anodization.

In 430, the deposition shield is anodized to form a surface anodization layer on the remaining unmasked surfaces. For example, when fabricating the deposition shield from aluminum, the surface anodization layer can comprise aluminum oxide ($Al_2O_3$). Methods of anodizing aluminum components are well known to those skilled in the art of surface anodization.

In 440, a protective barrier 150 is formed on the exposed surfaces 145. A protective barrier comprising, for example Yttria, can be formed using (thermal) spray coating techniques that are well known to those skilled in the art of ceramic spray coatings. In an alternate embodiment, forming the protective barrier can further comprise polishing (or smoothing) the thermal spray coating. For example, polishing the thermal spray coating can comprise the application of sand paper to the sprayed surfaces.

Figure 11:
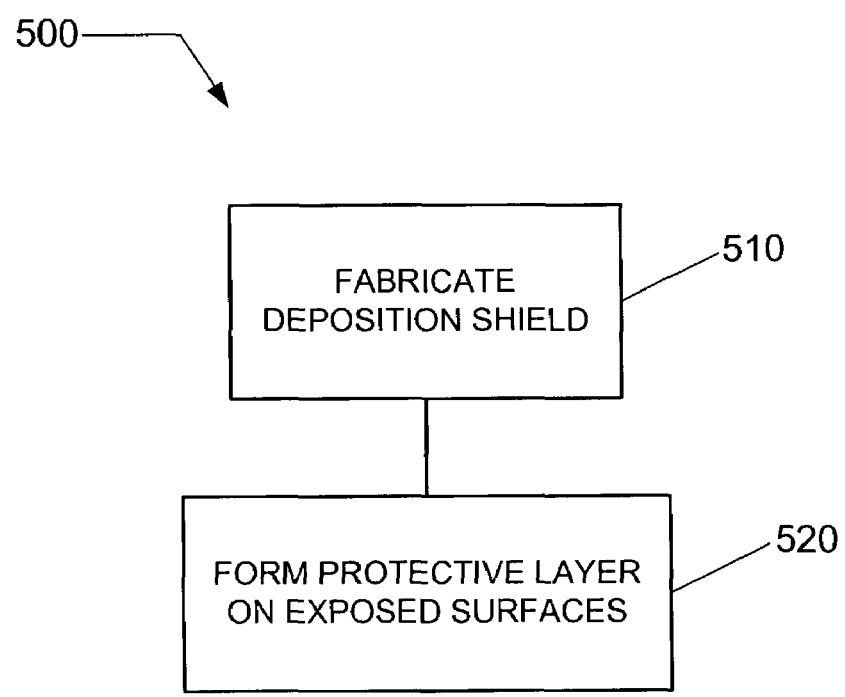
FIG. 11 presents a method of producing a deposition shield for a plasma processing system according to another embodiment of the present invention.

FIG. 11 presents a method of producing the deposition shield in the plasma processing system described in FIG. 1 according to another embodiment of the present invention. A flow diagram 500 begins in 510 with fabricating the deposition shield 14 (as described above). Fabricating the deposition shield can comprise at least one of machining, casting, polishing, forging, and grinding. For example, each of the elements described above can be machined according to specifications set forth on a mechanical drawing, using conventional techniques including a mill, a lathe, etc. The techniques for machining a component using, for example, a mill or a lathe, are well known to those skilled in the art of machining. The deposition shield can, for example, be fabricated from aluminum.

In 520, a protective barrier is formed on exposed surfaces of the deposition shield. A protective barrier comprising, for example Yttria, can be formed using (thermal) spray coating techniques that are well known to those skilled in the art of ceramic spray coatings. In an embodiment of the present invention, the exposed surfaces comprise the inner surface of the deposition shield, the upper end surface of the deposition shield, and the end lip surface of the lower end surface of the deposition shield. Alternately, the exposed surfaces can further comprise the first opening surface of the opening, and the mating surface excluding the fastening surface of the opening in the deposition shield. Alternately, the exposed surfaces comprise all surfaces on the deposition shield. In an alternate embodiment, forming the protective barrier can further comprise polishing (or smoothing) the thermal spray coating. For example, polishing the thermal spray coating can comprise the application of sand paper to the sprayed surfaces.

The processes of forming a protective barrier 150 on the exposed surfaces 145, described with reference to FIGS. 9–11 can be modified to utilize a combination of machining and masking. In such a modified process, at least one exposed surface 145 is masked to prevent formation of the anodization layer thereon while other exposed surfaces 145 are anodized. The exposed surfaces 145 that are unmasked are then machined, and the exposed surfaces that were masked are unmasked. The protective barrier 150 can then be formed on all the exposed surfaces 145. As described above, additional surfaces that are not exposed surfaces may also be machined during the method (e.g., in order to provide a better mechanical or electrical contact than would be formed with the anodization layer thereon).

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A deposition shield for surrounding a process space in a plasma processing system, comprising:
   a cylinder comprising an inner surface, an outer surface, an upper end surface, and a lower end surface, wherein said lower end surface further comprises:
      a first surface extending radially inward from said outer surface, and
      a protrusion adjacent to said inner surface and protruding from said first surface, said protrusion having an end lip surface thereon; and
   a protective barrier provided on a plurality of exposed surfaces of said deposition shield, wherein said exposed surfaces having said protective barrier thereon comprise said inner surface, said upper end surface, and said end lip surface of said lower end surface.

2. The deposition shield as recited in claim 1, wherein said deposition shield further comprises a plurality of fastening receptors coupled to said upper end surface and said first surface of said lower end surface of said deposition shield and configured to receive fastening devices in order to attach said deposition shield to said plasma processing system.

3. The deposition shield as recited in claim 2, wherein each of said plurality of fastening receptors comprises an entrant region, an entrant cavity, an exit through-hole, and an interior fastening surface.

4. The deposition shield as recited in claim 3, wherein said interior fastening surface of each of said plurality of fastening receptors comprises a first entrant surface, a first lip surface, a second entrant surface, a second lip surface, and an exit surface.

5. The deposition shield as recited in claim 1, wherein said deposition shield further comprises an opening in order to access said process space through said deposition shield.

6. The deposition shield as recited in claim 5, wherein said opening comprises:

a first opening surface extending radially inward from said outer surface,
a second opening surface extending radially outward from said inner surface, and
a mating surface coupling said first opening surface to said second opening surface.

7. The deposition shield as recited in claim 6, wherein said mating surface comprises at least one threaded hole and a fastening surface coupled thereto.

8. The deposition shield as recited in claim 1, wherein said deposition shield is at least partially formed of metal.

9. The deposition shield as recited in claim 8, wherein said metal comprises aluminum.

10. The deposition shield as recited in claim 1, wherein said protective barrier comprises a compound containing at least one of a group III element and a Lanthanon element.

11. The deposition shield as recited in claim 10, wherein said group III element comprises at least one of Yttrium, Scandium, and Lanthanum.

12. The deposition shield as recited in claim 10, wherein said Lanthanon element comprises at least one of Cerium, Dysprosium, and Europium.

13. The deposition shield as recited in claim 1, wherein said protective barrier comprises at least one of $Y_2O_3$, $Sc_2O_3$, $Sc_2F_3$, $YF_3$, $La_2O_3$, $CeO_2$, $Eu_2O_3$, and $DyO_3$.

14. The deposition shield as recited in claim 1, wherein said protective barrier comprises a minimum thickness and said minimum thickness is constant across at least one of said exposed surfaces having the protective barrier thereon.

15. The deposition shield as recited in claim 1, wherein said protective barrier comprises a variable thickness and said variable thickness ranging from 0.5 to 500 microns.

16. The deposition shield as recited in claim 6, wherein said plurality of exposed surfaces having the protective barrier thereon further comprise said first opening surface of said opening, and said mating surface of said opening in said deposition shield.

17. The deposition shield as recited in claim 7, wherein said plurality of exposed surfaces having the protective barrier thereon further comprise said first opening surface of said opening, and said mating surface excluding said fastening surface of said opening in said deposition shield.

18. The deposition shield as recited in claim 17, wherein said plurality of exposed surfaces having the protective barrier thereon further comprise said second opening surface of said opening.

19. The deposition shield as recited in claim 7, wherein said plurality of exposed surfaces having the protective barrier thereon further comprise said first opening surface of said opening, and said mating surface including said fastening surface of said opening in said deposition shield.

20. The deposition shield as recited in claim 19, wherein said plurality of exposed surfaces having the protective barrier thereon further comprise said second opening surface of said opening.

21. The deposition shield as recited in claim 19, wherein said outer surface comprises an anodization layer.

22. The deposition shield as recited in claim 19, wherein said second opening surface comprises an anodization layer.

23. The deposition shield as recited in claim 19, wherein said mating surface comprises a metallic surface.

24. The deposition shield as recited in claim 1, wherein said cylinder comprises a diameter greater than 200 mm.

25. The deposition shield as recited in claim 1, further comprising a recess radially positioned between said first surface and said protrusion, said recess being recessed from said first surface.

26. The deposition shield as recited in claim 25, wherein said protrusion further comprising a tapered transition surface extending from said end lip surface to a sidewall of said recess.

27. The deposition shield as recited in claim 26 wherein said protective barrier is provided on at least a portion of said transition surface.

28. The deposition shield as recited in claim 25, wherein said protective barrier is provided on said end lip surface and said protective barrier is not provided on said recess.

29. The deposition shield as recited in claim 1, wherein said upper end surface comprises:
a first surface extending radially outward from said inner surface; and
a protrusion adjacent to said outer surface and protruding from said first surface.

30. The deposition shield as recited in claim 29, further comprising a recess radially positioned between said first surface and said protrusion, said recess having a recess surface recessed from said first surface.

31. The deposition shield as recited in claim 29 wherein said protective barrier is provided on at least a portion of said upper end surface.

32. The deposition shield as recited in claim 29, wherein said protective barrier is provided on only a portion of said upper end surface.

33. The deposition shield of claim 30, wherein:
said protective barrier is provided on a portion of said upper end surface extending from said inner surface to said recess surface, and
said protective barrier is not provided on said recess surface.

34. The deposition shield as recited in claim 7, further comprising a recess recessed from said mating surface, said recess being positioned between said threaded hole and said second opening surface.

35. The deposition shield as recited in claim 34, wherein:
said protective barrier comprises a first protective barrier area provided on a portion of said mating surface extending from said first opening surface, and a second protective barrier area provided on a portion of said recess including a sidewall of said recess adjacent to said threaded hole, and
said fastening surfaces include a first fastening surface extending from said first protective barrier area to said threaded hole, and a second fastening surface extending from said second protective barrier area to said threaded hole.

36. The deposition shield as recited in claim 35, wherein:
said outer surface and said second opening surface are anodized, and
said threaded hole and said first and second fastening surfaces are not anodized and do not have said protective barrier provided thereon.

37. The deposition shield as recited in claim 1, wherein said protective barrier consists essentially of Yttria.

38. A deposition shield for surrounding a process space in a plasma processing system, comprising:
a cylinder comprising an inner surface, an outer surface, an upper end surface, and a lower end surface, wherein:
said upper end surface comprises a first surface extending radially outward from said inner surface to an upper end recessed surface that is recessed from said first surface, and
said lower end surface comprises a second surface extending radially outward from said inner surface to a lower end recessed surface that is recessed from said second surface; and a protective barrier provided on said inner surface, said first surface of the upper end surface, and said second surface of the lower end surface.

39. The deposition shield as recited in claim 38, wherein said protective barrier is provided on said first surface and is not provided on said upper end recessed surface.

40. The deposition shield as recited in claim 38, wherein said protective barrier is provided on said second surface and is not provided on said lower end recessed surface.

41. The deposition shield as recited in claim 40, wherein said protective barrier is provided on only a portion of said second surface.

42. The deposition shield as recited in claim 38, wherein said protective barrier consists essentially of Yttria.

43. A deposition shield for surrounding a process space in a plasma processing system, comprising:
a cylinder comprising an inner surface and an outer surface;
an upper end surface coupling said inner surface to said outer surface;
a lower end surface coupling said inner surface to said outer surface;
an opening having an opening surface coupling said inner surface to said outer surface; and
a protective barrier provided on said inner surface, said upper end surface, said lower end surface and said opening surface.

44. The deposition shield as recited in claim 43, wherein said opening surface comprises:
a first opening surface extending radially outward from said inner surface;
a second opening surface extending radially inward from said outer surface; and
a recess positioned between said first and second opening surfaces.

45. The deposition shield as recited in claim 44 wherein said protective barrier is provided on said first opening surface and provided on said second opening surface, and is not provided on said recess.

46. The deposition shield as recited in claim 43, wherein said lower end surface comprises:
a first surface extending radially inward from said outer surface;
a second surface extending radially outward from said inner surface; and
a recess radially positioned between said first surface and said second surface, said recess being recessed from said first surface and recessed from said second surface.

47. The deposition shield as recited in claim 46, wherein said protective barrier is provided on said second surface and is not provided on said recess.

48. The deposition shield as recited in claim 43, wherein:
said protective barrier is provided on only a portion of said upper end surface,
said protective barrier is provided on only a portion of said lower end surface, and
said protective baffler is provided on only a portion of said opening surface.

49. The deposition shield as recited in claim 43, wherein said protective baffler consists essentially of Yttria.

* * * * *

UNITED STATES PATENT AND TRADEMARK OFFICE
CERTIFICATE OF CORRECTION

| | |
|---|---|
| PATENT NO. | : 7,137,353 B2 |
| APPLICATION NO. | : 10/259353 |
| DATED | : November 21, 2006 |
| INVENTOR(S) | : Hidehito Saigusa et al. |

It is certified that error appears in the above-identified patent and that said Letters Patent is hereby corrected as shown below:

Change in Column 7, line 16, "DyO$_3$" to --Dy$_2$O$_3$--.
Change in Column 10, line 25, "DyO$_3$" to --Dy$_2$O$_3$--.

Signed and Sealed this

Sixteenth Day of October, 2007

JON W. DUDAS
*Director of the United States Patent and Trademark Office*